United States Patent [19]
Zhao et al.

[11] Patent Number: 5,517,123
[45] Date of Patent: May 14, 1996

[54] HIGH SENSITIVITY INTEGRATED MICROMECHANICAL ELECTROSTATIC POTENTIAL SENSOR

[75] Inventors: Yang Zhao, North Andover; Richard S. Payne, Andover, both of Mass.

[73] Assignee: Analog Devices, Inc., Mass.

[21] Appl. No.: 296,529

[22] Filed: Aug. 26, 1994

[51] Int. Cl.$^6$ .................................................. G01R 29/12
[52] U.S. Cl. ........................... 324/458; 324/457; 324/109
[58] Field of Search .......................... 324/72, 72.5, 109, 324/457, 458; 73/517 B, 517 R; 361/280

[56] References Cited

U.S. PATENT DOCUMENTS

| | | | |
|---|---|---|---|
| 3,911,738 | 10/1975 | Fischer | 73/517 B |
| 4,222,007 | 9/1980 | Comstock | 324/458 |
| 4,614,908 | 9/1986 | Daniele et al. | 324/458 |
| 4,711,128 | 12/1987 | Boura | 73/517 B |
| 4,835,461 | 5/1989 | Snelling | 324/458 |
| 5,151,659 | 9/1992 | Tanaka et al. | 324/458 |
| 5,345,824 | 9/1994 | Sherman et al. | 73/514.18 |
| 5,465,604 | 11/1995 | Sherman | 73/514.18 X |

OTHER PUBLICATIONS

*High–Sensitivity Micromechanical Electrostatic Voltmeter*, Loconto et al., The 7th Int. Conf. on Solid–State Sensors and Actuators, pp. 878–881, undated.

*Micromechanical Electrostatic Voltmeter*, Hsu et al., 1991 IEEE 91CH2817–5/910000–0659$01.00, month unavailable.

Primary Examiner—Kenneth A. Wieder
Assistant Examiner—Diep Do
Attorney, Agent, or Firm—Hale and Dorr

[57] ABSTRACT

The invention is a method and apparatus for electrostatic potential sensing by using electromechanical microstructures. The mechanical microstructure may be fabricated by either surface micromachining or bulk-micromachining. The sensor comprises a movable plate which is movable in the lateral dimension and which is suspended from and above a substrate bearing an isolated electrically conductive layer. The layer acts as the sensor electrode and is brought in contact with or near the object the electrostatic potential of which is to be sensed. The movable plate is suspended between two fixed, suspended and cantilevered plates. The three suspended plates collectively form two capacitors with the two fixed plates comprising the first plate of first and second capacitors and the movable plate comprising the second plate of both capacitors. A potential differential between the movable plate and the conductive layer causes lateral movement of the movable plate, resulting in a change in the capacitance of the two capacitors. Resolving circuitry converts the change in capacitance into an output signal indicative of the electrostatic difference between the movable plate and the conductive layer.

24 Claims, 5 Drawing Sheets

HIGH SENSITIVITY INTEGRATED MICROMECHANICAL ELECTROSTATIC POTENTIAL SENSOR

FIELD OF THE INVENTION

The invention pertains to electrostatic potential sensors. More particularly, the invention pertains to micromechanical electrostatic potential sensors.

BACKGROUND OF THE INVENTION

There are many situations in which it is desirable to sense the electrostatic potential of an object relative to a reference electrostatic potential. The present invention relates to an electrostatic sensor which can be used as a contact or non-contact type sensor. The term "non-contact" refers to the type of electrostatic potential sensor in which the sensing electrode is not brought contact with the object being sensed but only next to it so that a capacitance exists between the sensed object and the electrode. Shu, C. H. and Muller, R. S., "Micromechanical Electrostatic Voltmeter," *7th International Conference on Solid-State Sensors and Actuators (Transducers)*, San Fransisco, June 1991, pp. 659–662, disclose a micromachined non-contacting electrostatic voltmeter which works on the principal of intermittent shuttering and exposing a sensing electrode to an electric field between a remote electrode at a different potential and the sensing electrode. In particular, a sensing electrode is formed on the surface of a substrate. A polysilicon microshutter is cantilevered above the detector electrode on anchors. The shutter is rigidly coupled to a series of fingers which are suspended on the opposite side of the anchors. Those fingers are interdigitated with stationary fingers. The stationary fingers are coupled to an AC driving voltage which causes the entire suspended microstructure to oscillate. The oscillation of the suspended structure (which includes the fingers and the shutter) causes the shutter to continuously change, in a sinusoidal pattern, the area of the detector electrode which is overhung by the shutter. Suspended above the sensing electrode and the shutter is an input electrode which is electrically coupled via a conductor to the remote object to be sensed. The sensing electrode is coupled to an amplifier connected as a current-to-voltage converter. The output of the amplifier is forwarded to signal processing circuitry for measuring electrostatic potential. The oscillation of the shutter plate causes the voltage at the detector electrode to vary sinusoidally. The amplitude of the oscillation is a function of the voltage difference between the voltage at the input electrode (the voltage of the object being sensed) and ground.

Loconto, D. P. and Muller, R. S., "High-Sensitivity Micromechanical Electrostatic Volt Meter," *7th International Conference on Solid State Sensors and Actuators*, 1993, pp. 878–881, disclose a second generation version of the device disclosed in the above-identified paper.

The voltmeters disclosed in these two references are not particularly sensitive. Further, it is more preferable to differentially sense electrostatic potential as it allows for greater resolution by rejecting common mode noise in the system. Even further, these sensors are complicated to fabricate because they require two separate suspended layers, with one above the other.

SUMMARY OF THE INVENTION

The electrostatic sensor of the present invention comprises a suspended microstructure which is generally resilient and movable under electrostatic force. The structure is suspended over an electrically conductive plane which may be a metal surface over a dielectric layer on a silicon substrate of a circuit die. The movable plate is suspended between first and second generally fixed plates which are also suspended and cantilevered over the substrate but are generally immovable. The first fixed plate is charged to a first voltage, the movable plate is charged to a second voltage greater than the first voltage, and the second fixed plate is charged to a third voltage greater than both of the first two voltages. This arrangement forms a differential capacitor arrangement comprising first and second capacitors. The first and second fixed plates comprise the first electrodes of the first and second capacitors, respectively. The movable plate comprises the second electrode of both capacitors. When the movable electrode moves, the capacitance of each of the two capacitors changes, with one capacitance increasing and the other decreasing.

The two fixed plates and the movable plate are coupled to resolving circuitry which detects lateral movement of the movable plate. Preferably, the resolving circuitry comprises a closed loop circuit which electrostatically balances the movable plate and forces it back to an equilibrium position centered between the two fixed plates when it is moved off center.

The conductive plane and dielectric on top of the substrate is electrically coupled to a remote electrode which is placed on the object whose electrostatic potential is to be sensed (or near the object, if non-contact sensing is to be performed). When the voltage on the top surface of the substrate changes, there exists a net lateral force change on the movable plate which causes the plate to move, resulting in a change in the capacitance of the two capacitors which is sensed by the resolving circuitry.

DETAILED DESCRIPTION OF THE INVENTION

Figure 1:
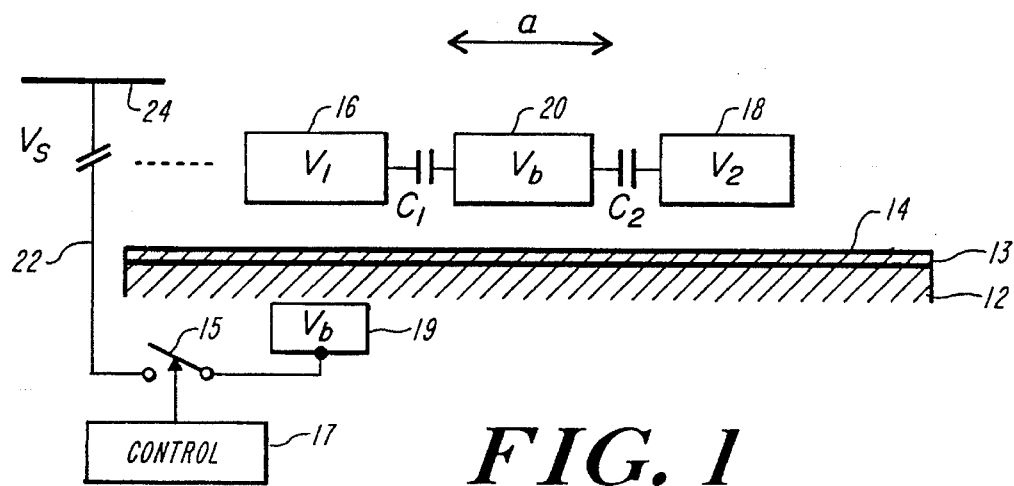
FIG. 1 schematically illustrates the sensor portion of the present invention.

FIG. 1 pictorially and schematically illustrates the components of the sensor portion of the present invention. The structure comprises a substrate 12 having a dielectric insulating layer 13 and a conductive top surface 14. The substrate 12 is silicon or a silicon diffusion. The top surface 14 may be a conductive polysilicon coat or may be a metal film, so long as it is conductive. The dielectric layer 13 is normally silicon dioxide or silicon nitride on silicon dioxide. The substrate 12 may be p-type or n-type. In addition, a doped diffusion region may be formed in the substrate in the sensor area. For example, in at least one preferred embodiment of the invention (not shown), the substrate is a p-type substrate with an n+ diffusion beneath the conductive layer 14 in the sensor area.

The conductive layer 14 is coupled via an electrical conductor 22 to a sensing electrode 24 which is to be placed on or near the surface which is to be electrostatically sensed. The dielectric layer isolates the conductive layer 14 from the substrate 12 so that the layer 14 can float with the voltage of electrode 24.

Suspended from posts above the substrate are two fixed electrically conductive plates 16 and 18 and one movable electrically conductive plate 20. The fixed plates 16 and 18 are generally immovable under the electrostatic forces to which the device is expected to be subject. The movable plate 20, however, is suspended by resilient means which will allow the plate 20 to move laterally in the direction of arrow a in FIG. 1 under the electrostatic forces to which the device will be subject.

Stationary plate 16 is charged to a first D.C. voltage, e.g., 0.2 volts. Movable plate 20 is charged to a second D.C. voltage, e.g., 1.8 volts, and stationary plate 18 is charged to a third voltage, e.g., 3.4 volts. The three plates are positioned with their side faces parallel to each other and are separated by about 1 micron. As such, the three plates 16, 18 and 20 form two capacitors, C1 and C2. In the preferred embodiment, in the absence of any force, plate 20 preferably is equidistant from plates 16 and 18. Also in the preferred embodiment, plate 20 is charged to a voltage halfway between plates 16 and 18. However neither condition is necessary for the proper operation of the invention.

Thus, in the absence of force, the voltage across capacitor C1 is equal to the voltage across capacitor C2, namely 1.6 volts. The voltage across capacitor C1 creates an electrostatic force which attracts movable plate 20 towards stationary plate 16. However, there is an equal and opposite attraction between movable plate 20 and stationary plate 18. Accordingly, in the absence of any forces other than the spring restoring force provided by the suspension of the movable plate, movable plate 20 remains positioned exactly halfway between stationary plates 16 and 18 with a 1.6 volt differential between movable plate 20 and each of stationary plates 16 and 18. This condition is herein termed the equilibrium position.

The voltage on underlying layer 14, however, affects the equilibrium of suspended plates 16, 18 and 20. In particular, when the voltage on layer 14 is equal to the voltage of the movable plate 20, e.g., 1.8 volts, there is no electrostatic force between movable plate 20 and the layer 14. There is, however, an electrostatic force between the layer 14 and each of stationary plates 16 and 18. When the voltage on layer 14 is halfway between the voltages on stationary plates 16 and 18, the electrostatic force between layer 14 and plate 16 is equal to the electrostatic force between plate 18 and layer 14. The electrostatic force between the layer 14 and all of plates 16, 18 and 20 is substantially vertical, whereas the electrostatic forces between the plates themselves are lateral in FIG. 1. Thus, when, for example, stationary plate 16 is at 0.2 volts, stationary plate 18 is at 3.4 volts, and movable plate 20 and layer 14 are both at 1.8 volts, the net lateral electrostatic force on movable plate 20 is zero and movable plate 20 remains at equilibrium, equidistant between plates 16 and 18. However, despite the fact that the electrostatic force between the layer 14 and any of the suspended plates 16, 18 and 20, if any, is in the vertical direction, when a voltage differential exists between movable plate 20 and layer 14, a net lateral electrostatic force change occurs.

In particular, as the voltage on layer 14 moves away from the voltage on movable plates 20, the net lateral electrostatic force on plate 20 increases in the direction of the stationary plate having a voltage closer to the voltage on the layer 14. Thus, for instance, if the voltage on layer 14 was 0.3 volts rather than 1.8 volts, the net lateral electrostatic force on movable plate 20 would be to the left in FIG. 1, thus causing movable plate 20 to move towards the left.

Figure 2:
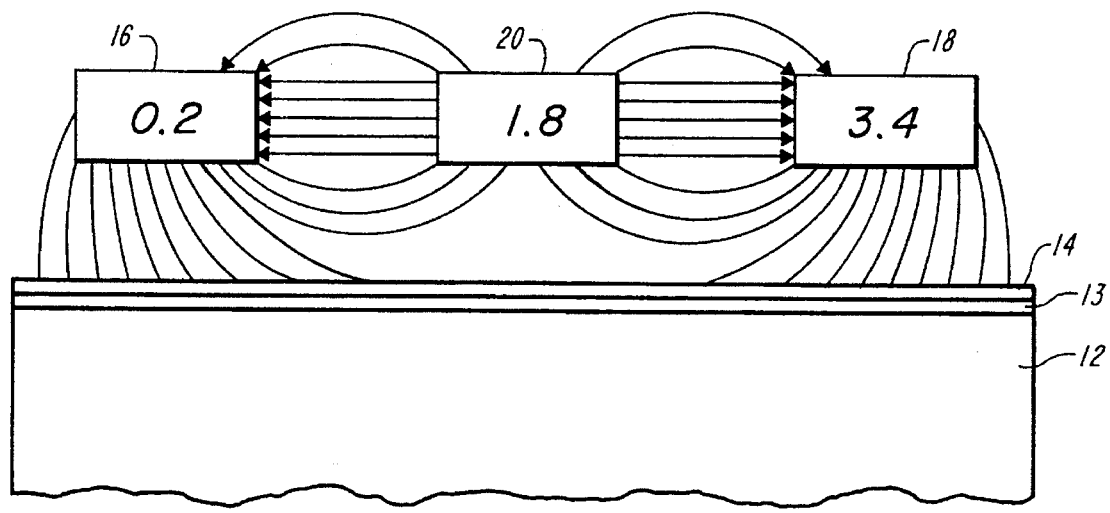
FIGS. 2 and 3 illustrate exemplary electrostatic force lines for the sensor of FIG. 1 under two different sensed potential conditions.
Figure 3:
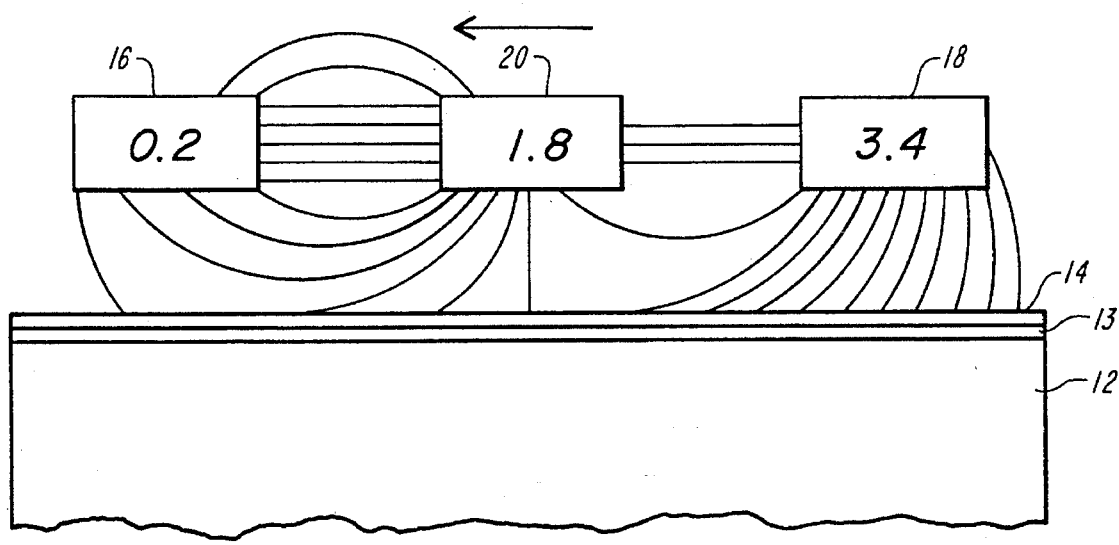

FIGS. 2 and 3 help illustrate the change in net electrostatic force on moveable plate 20. FIG. 2 illustrates the electrostatic field, E, (and thus the force lines) between the variously charged portions of the structure at equilibrium. As shown, there is no electrostatic force between the layer 14 and movable plate 20 since they are charged to the same voltage. However, there is a lateral electrostatic force as a result of the 1.6 volt potential difference between plates 16 and 20 and an equivalent lateral electrostatic force as a result of the 1.6 volt potential difference between plates 20 and 18. There also is a vertical electrostatic force between stationary plate 16 and layer 14 as well as between stationary plate 18 and layer 14. These two forces are also equal since there is a 1.6 volt potential difference between each. As can be seen in the figure, the net electrostatic force lines resulting from all of these component forces is not strictly lateral or vertical. Since there are competing voltage differentials, among other reasons, the force lines are curved as shown. Yet the net lateral force on movable plate 20 is zero.

When the voltage on layer 14 is changed to 0.3 volts, such that it is much closer to the voltage on plate 16 (only a 0.1 volt difference) and much further from the voltage on plate 18, (a 3.1 volt difference), the force lines change as shown in FIG. 3. As can be seen, there is now very little electrostatic force between layer 14 and plate 16 while there has been an increase in electrostatic force between layer 14 and plate 18. Accordingly, more of the electrostatic force acting on stationary plate 18 is directed down to the substrate and less is directed to movable plate 20. Likewise, of the electrostatic forces acting on stationary plate 16, very little is directed vertically to layer 14 (because their voltages are almost equal) and more is directed towards movable plate 20. Accordingly, there is a greater electrostatic attraction of plate 20 towards plate 16 than towards plate 18. Accordingly, movable plate 20 moves towards fixed plate 16, resulting in an increase in the capacitance of capacitor C1 and a decrease in the capacitance of capacitor C2.

The capacitive terminals can be coupled to resolving circuitry for detecting the differential change in capacitance across capacitors C1 and C2 and converting it into a usable signal indicative of the net force on movable plate 20. The net force on movable plate 20 is a direct indication of the voltage change on layer 14 (which is the sensed voltage via remote electrode 24).

Of course, a potential difference between the layer 14 and movable plate 20 results in an electrostatic force which is primarily vertical, with only a small lateral component due to the interaction of all of the electrostatic forces. However, only the lateral component is sensed. The vertical force is essentially irrelevant vertical movement of movable plate 20 does not result in any appreciable net change in the voltage differential between capacitors C1 and C2 due to the differential capacitor geometry. Therefore, vertical movement of the plates does not result in any significant change in the output signal of the resolving circuitry, as will become clear from the below discussion of the resolving circuitry in connection with the circuit diagrams of FIGS. 4, 5A and 5B.

The apparatus described above can be used for both contact and non-contact sensing. Depending on the specific application, non-contact or contact sensing may be most desirable. In contact sensing, the electrode is placed in physical contact with the surface whose potential is to be sensed. A drawback to this approach is that the contact of the electrode 24 to the surface to be sensed actually effects to voltage on that surface. Accordingly, if extremely high precision sensing is desired, non-contact sensing may be preferable. However, in non-contact sensing, the electrode 24 (and thus the layer 14) actually do not receive the exact voltage of the object being sensed. Rather, it receives a different voltage through the capacitance which exists between two electrically conductive bodies, i.e., the object and the electrode, which are placed close to one another. Accordingly, the voltage which appears on electrode 24 and layer 14 is not the voltage which appears on the surface but is a voltage which is directly related thereto. Accordingly, the actual voltage of the object being sensed can be calculated from the voltage which appears on electrode 24.

It is important that no unwanted charge inadvertently build up on layer 14. However, charge will generally build up on layer 14, especially when the device is used for non-contact sensing. In particular, when electrode 24 is brought near a surface to be sensed but is not contacted to it, charge can build up on layer 14 from sources other than the surface which is to be measured. Accordingly, in a preferred embodiment of the invention, layer 14 is electrically coupled via a switch 15 to a voltage source 19 which, when the switch 15 is closed, brings layer 14 to a predetermined desired voltage. As will be described below in further detail, in at least one embodiment of the invention, that voltage is the voltage on movable plate 20. A control circuit 17 controls the switch so as to close the switch at predetermined intervals which are often enough to prevent a significant charge to build up in between closings of the switch. The interval might be one second. Obviously, measurements should not be taken when the switch is closed, but only when the switch is open and the layer 14 is free-floating and subject only to the voltage on electrode 24.

Figure 4:
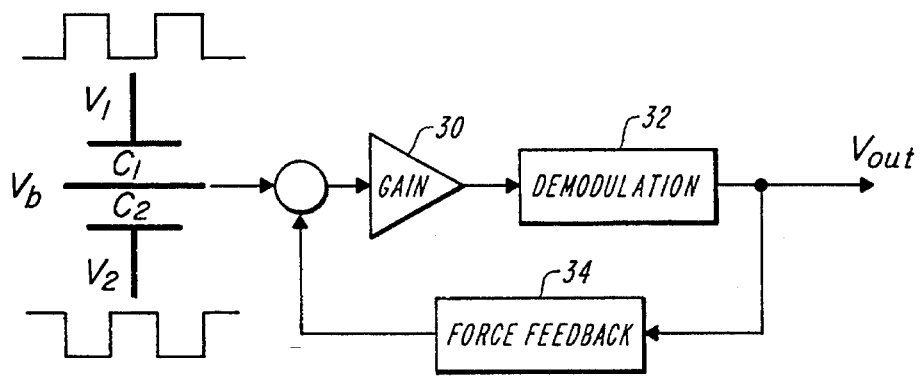
FIG. 4 is a block diagram of exemplary resolving circuitry of the present invention.

FIG. 4 is a simplified block diagram of exemplary resolving circuitry. In this example, two identical 1 MHz carrier signals of opposite phase are applied to stationary plates 16 and 18, respectively. As previously noted, plate 16 also is charged with a D.C. bias voltage of 0.2 volts, plate 18 is charged with a D.C. bias voltage of 3.4 volts and movable plate 20 is charged with a D.C. bias of 1.8 volts. The substrate is D.C. biased to 1.8 volts. When the movable plate 20 is displaced from its equilibrium position, a mismatched carrier signal is delivered from the movable plate due to the mismatch of capacitors C1 and C2. This signal is sent to an amplifier 30 and a demodulator 32 to produce a D.C. voltage indicative of the displacement of the plate 20, which in turn is indicative of the voltage on the sensing electrode layer 14. In a preferred embodiment, a force feedback loop 34 is added to balance the displacement of the movable plate 20 by Superimposing the demodulated output voltage on the D.C. bias voltage on plate 20.

Figure 5A:
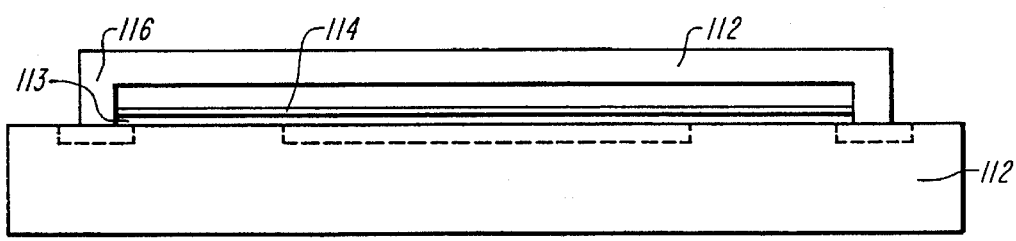
FIGS. 5A and 5B illustrate a preferred embodiment of the sensor portion of the present invention in plan view and side view, respectively.
Figure 5B:
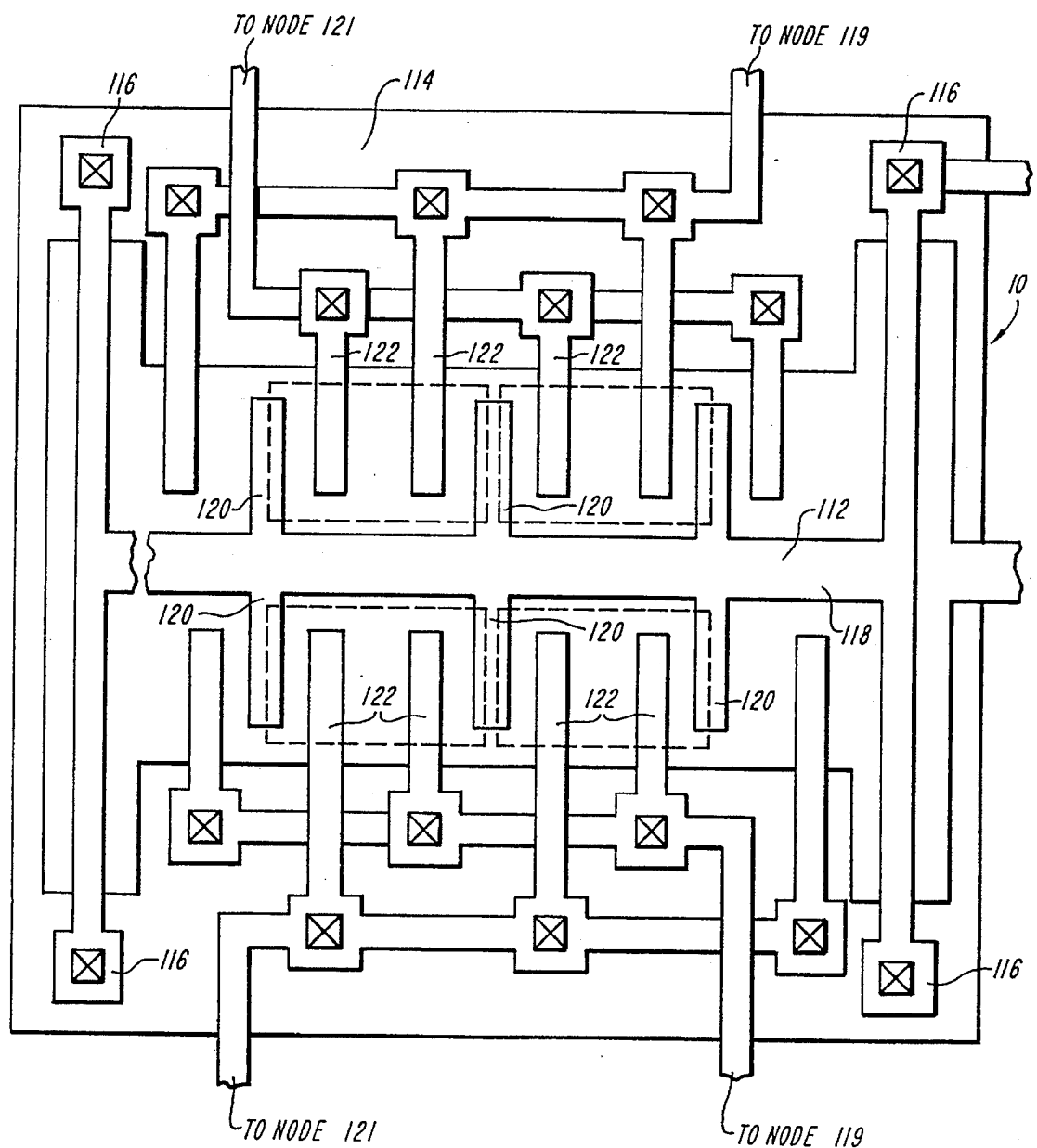

FIGS. 5A and 5B are plane and side views of a preferred geometry of the sensor 10. The microstructure comprises a bridge 112 suspended above a conductive layer 114 which is atop a dielectric layer 113 and a substrate 112 by four corner anchors 116. The bridge comprises a central beam 118 having a plurality of fingers 120 extending transversely therefrom. A suspended polysilicon stationary finger 122 is positioned parallel and adjacent to each finger 120 of the bridge 112. Stationary fingers 122 are also suspended on anchors and cantilevered over the substrate but are substantially stationary because of their smaller mass and shorter length of extension beyond the anchor. The polysilicon of the stationary fingers 122 and the bridge 112 is electrically conductive. The stationary fingers are connected via substrate embedded conductors (only partially shown at 117) to comprise two electrical nodes. In particular, the stationary fingers which are to the left of the corresponding movable fingers form a first node 119 which is charged to a first voltage, e.g., 0.2 volts, and the stationary fingers which are to the right of the corresponding movable fingers form a second node 121 which is charged to a second voltage, e.g., 3.4 volts. The beam 112, including the movable fingers, is charged to a third voltage between the first and second voltages, e.g., 1.8 volts. The substrate also is biased to the third voltage.

The first and second sets of stationary fingers and the movable fingers form two capacitors with the two sets of stationary fingers forming the first plates of first and second capacitors, respectively, and the movable fingers forming the second plate of both of the capacitors.

The layer 114 is connected to a bond pad (not shown) which in turn is connected to an output pin of the chip (also not shown). The output pin is electrically coupled to an electrode (not shown) which should be placed on or near the object whose electrostatic potential is to be sensed. When an electrostatic potential other than 1.8 volts exists on the object being sensed, it causes the voltage on the layer 114 to shift away from its bias voltage of 1.8 volts. As described above with respect to FIGS. 1, 2 and 3, this results in a net lateral electrostatic force on the beam 112 causing the beam to move laterally. When the beam 112 moves relative to the stationary fingers, it alters the capacitance between each stationary finger 122 and its corresponding beam finger 120.

Figure 6:
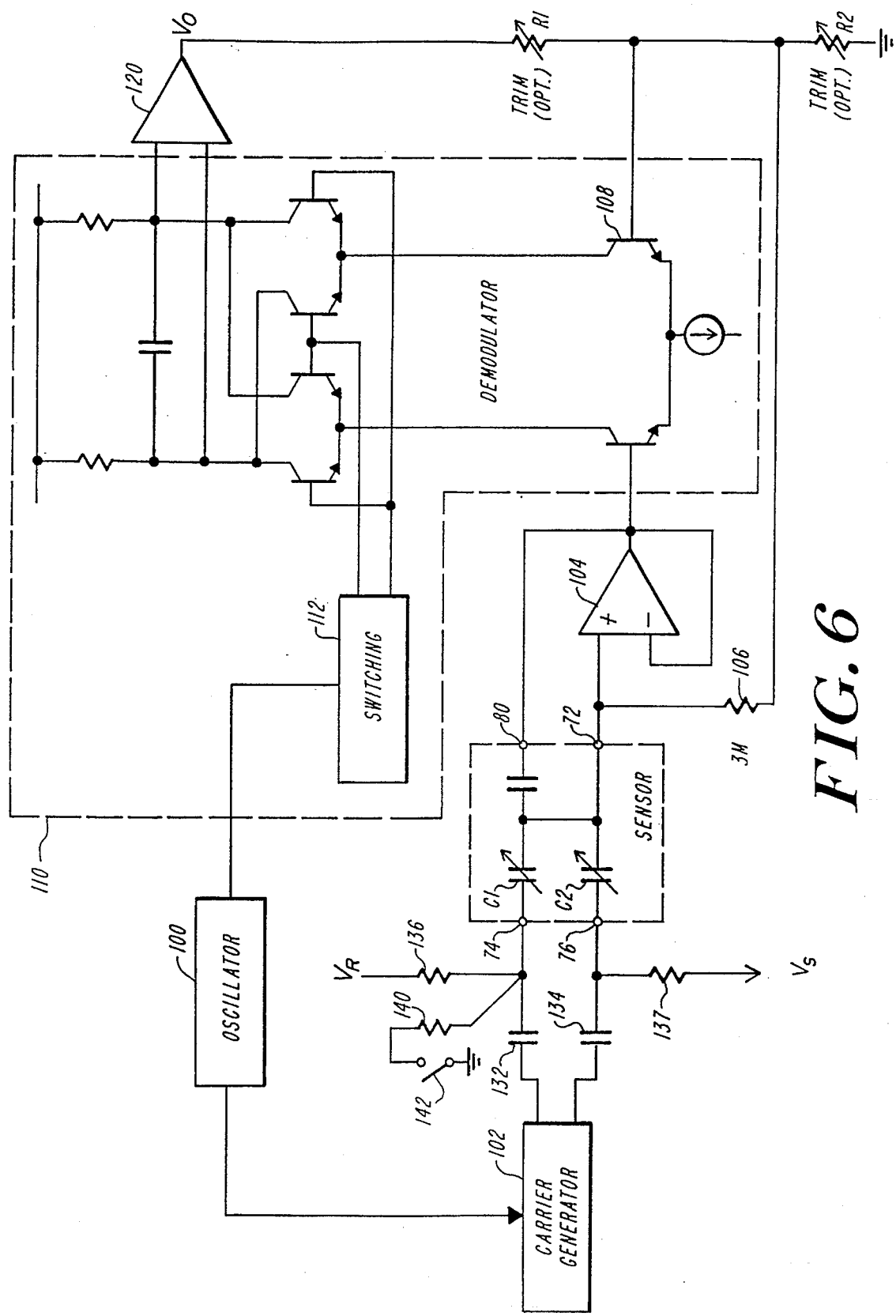
FIG. 6 is a more detailed schematic diagram of a preferred embodiment of the resolving circuitry of the present invention.

FIG. 6 schematically illustrates an exemplary resolving circuit for use with the sensor of the present invention in accordance with the block diagram of FIG. 4. Oscillator 100 supplies a 1 MHz sinusoidal signal to a carrier generator 102. The carrier generator supplies therefrom two 1 MHz sinusoidal output signals 180° out of phase from each other. Thus, the output signals are of the form $V_n \sin Wt$ and $-V_n \sin Wt$, where W is the angular frequency of the oscillator output signal. The first carrier signal is supplied to terminal 74 of the sensor, while the second carrier signal is supplied to terminal 76. Sensor output terminal 72 is connected to the non-inverting input of a buffer amplifier 104. The output of the buffer amplifier is connected to sensor terminal 80, a boot strap diffusion contact. Through this connection, the parasitic capacitance is prevented from loading the common node 72.

The output of the buffer feeds a synchronous switching demodulator 110. The demodulator includes a switching circuit 112 which is connected and responsive to the output of oscillator 100. The double-ended output from the demodulator is converted to a single-ended output $V_o$ by a buffer amplifier 120.

The carrier generator is A.C.-coupled to the sensor through capacitors 132 and 134. Capacitors 132 and 134 may typically be about 30–50 pF each, to exhibit low impedance at the 1 MHz carrier frequency. To establish a net electrostatic force on the sensor capacitor plates, input terminal 74 and 76 are connected, respectively, to offset (reference) supplies $V_R$ and $V_S$ (e.g., 0.2 and 3.4 volts, respectively), through resistors 136 and 138, each typically being about 300K ohms. When the voltage across the capacitors C1 and C2 are equal, the electrostatic potential across the capacitors is balanced. By contrast, when there is a net lateral electrostatic force, as is caused when a voltage other than 1.8 volts exists on the layer 14, the voltages across capacitors C1 and C2 become unbalanced. The demodulator detects this imbalance, which causes a change in the signal at the non-inverting input of amplifier 104, and supplies a feedback signal through resistor 106 to create a net electrostatic force to equalize the unbalancing force. Thus, the feedback signal providing for force balancing is supplied by connecting the junction of resistor 106 and the second demodulator signal input at the base of transistor 108 to the output of buffer 120.

Preferably, the plates are suspended about 1.5 microns above the layer 14 and the gap between the fingers is about 1 micron. The finger cross-sections are preferably approximately 2 microns by 3 microns.

The present invention is similar in structure, though not in operation, to the invention disclosed in PCT patent publication No. WO92/03740 which is owned by the same assignee of the present invention. That publication discloses a suspended microstructure and associated resolving circuitry for sensing acceleration forces in the plane of the sensor and is not related to electrostatic potential sensing.

Since the capacitors are coupled in a differential capacitor arrangement and the output of the resolving circuitry is a function of the differential between the two capacitors, common mode noise is rejected. The sensing resolution of the system is limited either by the Brownian thermal noise of the mechanical structure or the electronic noise, which ever is higher.

Figure 7:
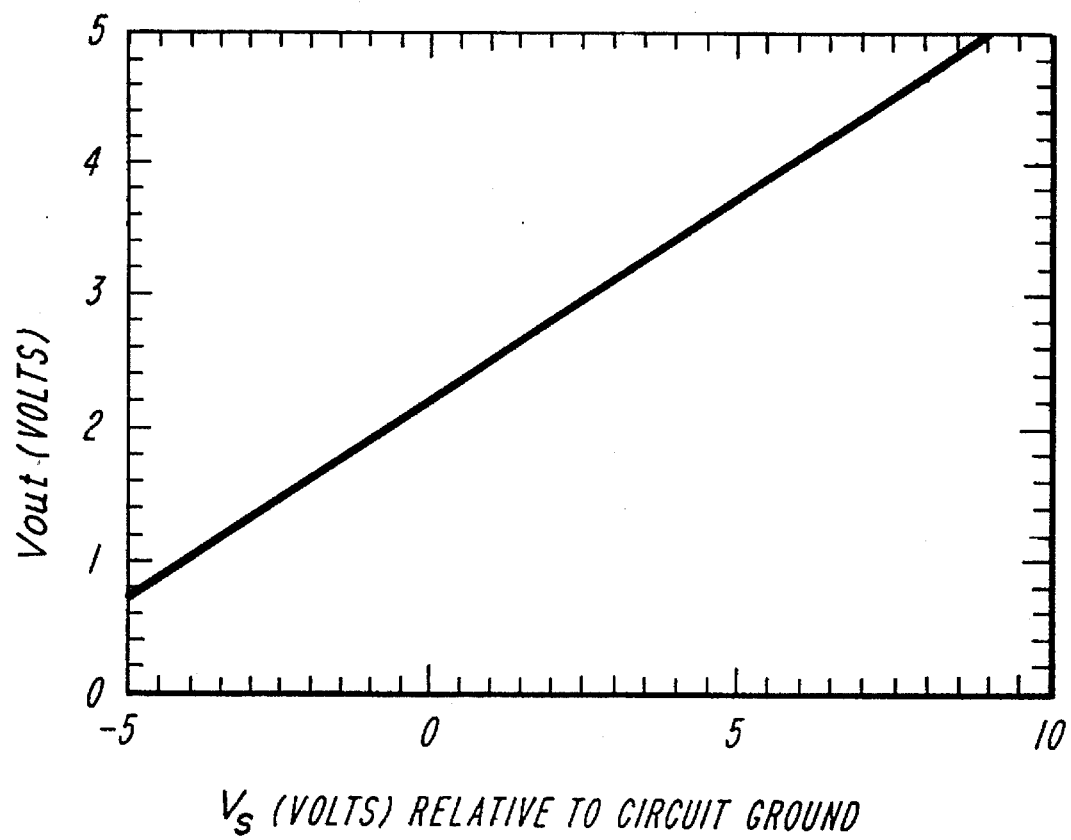
FIG. 7 is a graph illustrating the output voltage of a prototype of the present invention as a function of sensed voltage of the object being sensed for a prototype of the present invention.

FIG. 7 is a graph showing $V_{out}$ as a function of sensed voltage on layer 14, $V_s$, of a prototype chip manufactured generally in accordance with the preferred embodiment disclosed herein. As seen from FIG. 7, $V_{out}$ is highly linearly proportional to the sensed potential $V_s$. The high linearity is due to the fact that the system is designed to be extremely sensitive to the lateral displacement of the moveable beam and is insensitive to the vertical displacement of the beam.

In general, the Brownian noise level will decrease as the mass of the beam increases and/or the damping effect is lowered.

The sensitivity of the system, $V_{out}/V_s$, depends on the geometric dimensions and the D.C. bias of the mechanical structure. For a particular structure, the sensitivity can be increased by increasing the D.C. voltage differential between the two stationary plates.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An apparatus for sensing electrical potential of an object, the apparatus comprising:

a semiconductor substrate, a dielectric layer over said substrate, a conductive layer over said dielectric layer, first and second electrically conductive and substantially stationary plates suspended above said conductive layer, said first and second plates being substantially coplanar in a plane parallel to said conductive layer and charged to first and second bias voltages, respectively, a third electrically conductive plate suspended above said conductive layer in said plane between said first and second plates such that said first, second, and third plates form first and second capacitors, said first plate forming a first electrode of the first capacitor, said second plate forming a first electrode of the second capacitor, and said third plate forming a second electrode of both of said first and second capacitors with said third plate being resiliently suspended such that said third plate is movable in said plane in response to electrostatic force and is biased to a third voltage, a remote electrode, electrically coupled to said conductive layer, for placement at least electrically proximal to the object whose electrical potential is being sensed, and resolving circuitry coupled to said first and second capacitors for detecting movement of said third plate relative to said first and second plates.

2. An apparatus as set forth in claim 1 wherein said third electrode is substantially immovable perpendicularly to said plane.

3. An apparatus as set forth in claim 2 wherein said third voltage is between said first and second voltages.

4. An apparatus as set forth in claim 3 further comprising:

a voltage source which supplies a voltage equivalent to said third voltage, a switch coupling said voltage source to said conductive layer, and a controller for periodically closing said switch for a predetermined period such that said conductive layer is coupled to said voltage source.

5. An apparatus as set forth in claim 4 wherein said third voltage is half way between said first and second voltages.

6. An apparatus as set forth in claim 3 wherein said resolving circuit comprises:

circuitry for generating first and second sinusoidal signals of equal amplitude and opposite phase and supplying said first and second sinusoidal signals to said first and second plates, respectively, and a demodulator coupled to receive the voltage on said third plate.

7. An apparatus as set forth in claim 6 wherein said resolving circuitry further comprises an amplifier coupled between said third plate and said demodulator.

8. An apparatus as set forth in claim 7 wherein said resolving circuitry further comprises a force feedback loop for forcing said third plate back to a neutral position when it is displaced.

9. An apparatus as set forth in claim 8 wherein said third plate comprises a polysilicon bridge suspended above said surface by a plurality of anchors extending from said surface, said bridge comprising a pair of resilient members coupled to said anchors, a central beam coupled at opposite ends thereof to said first and second resilient members, respectively, and a plurality of generally parallel movable fingers extending transversely from said beam, and said first and second plates comprises a plurality of generally parallel electrically conductive substantially stationary fingers, each of said stationary fingers corresponding to one of said movable fingers and positioned relative to said corresponding movable finger such that said corresponding movable finger and stationary finger form a capacitor, wherein a first set of said stationary fingers comprises said first plate, each of said first set of stationary fingers positioned on one side of said corresponding movable finger, and wherein a second set of said stationary fingers comprises said second plate, each of said second set of stationary fingers positioned on an opposite side of said corresponding movable finger, and wherein said first set of stationary fingers are electrically coupled to a first node and said second set of stationary fingers are electrically coupled to a second node.

10. An apparatus as set forth in claim 1 wherein said first, second and third plates are formed of polysilicon suspended from anchors extending upwardly from said substrate.

11. An apparatus as set forth in claim 1 wherein said conductive layer comprises a metal formed over said substrate and said dielectric.

12. An apparatus for sensing electric potential of an object, the apparatus comprising:

a semiconductor substrate, a dielectric layer over said substrate, a conductive layer over said dielectric layer, a movable plate that includes a polysilicon bridge suspended above said conductive layer by a plurality of anchors extending from said substrate, said bridge including first and second resilient members coupled to said anchors, a central beam coupled at opposite ends thereof to said first and second resilient members, respectively, and a plurality of substantially parallel movable fingers extending transversely from said beam, said bridge being substantially planar in a plane above and parallel to said conductive layer and substantially immovable perpendicular to said plane, said movable plate being biased to a third voltage, first and second substantially stationary plates, each including a plurality of substantially parallel, electrically conductive polysilicon fingers suspended above said conductive layer, each of said stationary fingers corresponding to at least one of said movable fingers and positioned relative to said corresponding movable finger such that each pair of corresponding movable and stationary fingers forms a capacitor, with a first set of said movable fingers including said first plate and are positioned on one side of said corresponding stationary fingers and are coupled to a first node, and a second set of stationary fingers including said second plate and are positioned on an opposite side of said corresponding movable fingers and are coupled to a second node, and with said first and second stationary plates and said movable plate forming a differential pair of capacitors including first and second capacitors, said first and second stationary plates being biased to first and second voltages, respectively, a remote electrode, electrically coupled to said conductive layer, for placement at least electrically proximal to the object whose electrical potential is being sensed, and resolving circuitry coupled to said first and second capacitors for detecting movement of said movable plate relative to said first and second plates.

13. An apparatus as set forth in claim 12 further comprising:

a voltage source which supplies a voltage equivalent to said third voltage, a switch coupling said voltage source to said conductive layer, and a controller for periodically closing said switch for a predetermined period such that said conductive layer is coupled to said voltage source.

14. An apparatus as set forth in claim 13 wherein said third voltage is 1.8 volts, said first voltage is 0.2 volts and said second voltage is 3.4 volts.

15. An apparatus as set forth in claim 12 wherein said resolving circuit comprises:

circuitry for generating first and second signals of equal amplitude and opposite phase and supplying said first and second sinusoidal signals to said first and second plates, respectively, and a demodulator coupled to receive the voltage on said third plate.

16. An apparatus as set forth in claim 15 wherein said resolving circuitry further comprises an amplifier coupled between said third plate and said demodulator.

17. An apparatus as set forth in claim 16 wherein said resolving circuitry further comprises a force feedback loop for forcing said third plate back to a neutral position when it is displaced.

18. A method for sensing electrical potential of an object with a sensor having a conductive layer, first and second electrically conductive plates suspended above and substantially stationary relative to the conductive layer, and a third electrically conductive plate suspended above the conductive layer between the first and second plates, the first, second, and third plates lying in a plane parallel to the conductive layer and forming a differential capacitor, the method comprising the steps of:

positioning a remote electrode at least electrically proximal to the object, the electrode being electrically coupled to the conductive layer to provide a voltage to the conductive layer to cause the third plate to move in the plane relative to the first and second plates in response to a change in the voltage on the conductive layer;

sensing movement of the third plate relative to the first and second plates; and using the sensed movement to determine the electrical potential of the object.

19. The method of claim 18, wherein the positioning step includes positioning the electrode near the object to perform non-contact sensing.

20. The method of claim 18, wherein the positioning step includes positioning the electrode on the object to perform contact sensing.

21. The method of claim 18, further comprising a step of generating first and second signals of equal amplitude and opposite phase and applying the first and second signals to the respective first and second plates.

22. The method of claim 18, wherein the sensing step includes determining the electrical potential with a force feedback loop.

23. A method comprising using the apparatus of claim 1 to sense the electrical potential of the object.

24. A method comprising using the apparatus of claim 12 to sense the electrical potential of the object.

* * * * *